United States Patent
Lenoble et al.

(10) Patent No.: US 8,034,689 B2
(45) Date of Patent: Oct. 11, 2011

(54) METHOD FOR FABRICATING A SEMICONDUCTOR DEVICE AND THE SEMICONDUCTOR DEVICE MADE THEREOF

(75) Inventors: Damien Lenoble, Ixelles (BE); Rita Rooyackers, Kessel-lo (BE)

(73) Assignees: IMEC, Leuven (BE); STMicroelectronics (Crolles2) SAS, Crolles Cedex (FR)

( * ) Notice: Subject to any disclaimer, the term of this patent is extended or adjusted under 35 U.S.C. 154(b) by 165 days.

(21) Appl. No.: 12/340,298

(22) Filed: Dec. 19, 2008

(65) Prior Publication Data

US 2009/0184358 A1    Jul. 23, 2009

Related U.S. Application Data

(60) Provisional application No. 61/015,454, filed on Dec. 20, 2007.

(30) Foreign Application Priority Data

Mar. 28, 2008 (EP) .................................... 08153499

(51) Int. Cl.
*H01L 21/336* (2006.01)
(52) U.S. Cl. .. 438/283; 438/486; 438/530; 257/E21.421
(58) Field of Classification Search .................. 438/283, 438/486, 530, 795; 257/E21.421
See application file for complete search history.

(56) References Cited

U.S. PATENT DOCUMENTS

| | | |
|---|---|---|
| 6,720,619 B1 | 4/2004 | Chen et al. |
| 6,746,936 B1 | 6/2004 | Lee |
| 7,449,373 B2 * | 11/2008 | Doyle et al. ............. 438/149 |
| 7,514,346 B2 * | 4/2009 | Chau et al. ............. 438/591 |
| 2004/0005764 A1 | 1/2004 | Wu et al. |
| 2004/0166642 A1 | 8/2004 | Chen et al. |
| 2005/0167750 A1 | 8/2005 | Yang et al. |
| 2005/0227435 A1 | 10/2005 | Oh et al. |

FOREIGN PATENT DOCUMENTS

| | | |
|---|---|---|
| GB | 2370915 A | 7/2002 |
| WO | WO 99/27578 | 6/1999 |

OTHER PUBLICATIONS

Lee, et al., Hydrogen Annealing Effect on DC and Low-Frequency Noise Characteristics in CMOS FinFETs, IEEE Electron Device Letters, vol. 24, No. 3, Mar. 2003.

Xiong, et al., Improvement of FinFET Electrical Characteristics by Hydrogen Annealing, IEEE Electron Device Letters, vol. 25, No. 8, Aug. 2004.

Zaman, et al., Effects of Hydrogen Annealing Process Conditions on Nano Scale Silicon, Mater. Res. Soc. Symp. Proc., vol. 872, Materials Research Society, 2005.

Extended European Search Report dated Jul. 21, 2008, for EP Application No. 08153499.2.

* cited by examiner

*Primary Examiner* — Tuan N. Quach
(74) *Attorney, Agent, or Firm* — Knobbe Martens Olson & Bear LLP

(57) ABSTRACT

A method for fabricating a semiconductor device and the device made thereof are disclosed. In one aspect, the method includes providing a substrate comprising a semiconductor material. The method further includes patterning at least one fin in the substrate, the fin comprising a top surface, at least one sidewall surface, and at least one corner. A supersaturation of point defects is created in the at least one fin. The at least one fin is annealed and then cooled down such that semiconductor atoms of the semiconductor material migrate via the point defects.

24 Claims, 15 Drawing Sheets

Ge implant 80 keV 45tilt

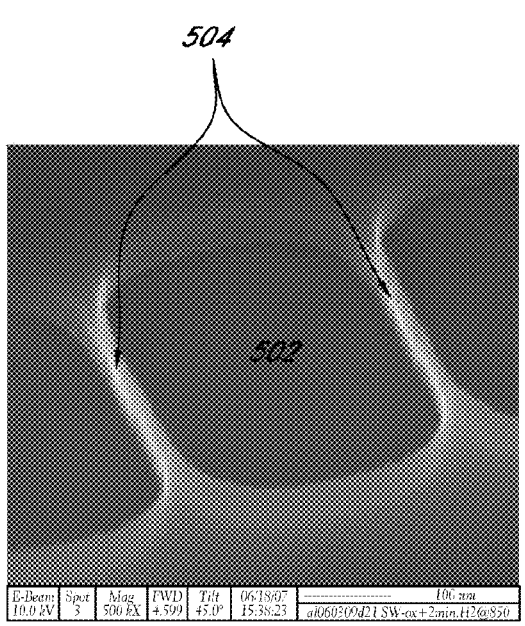 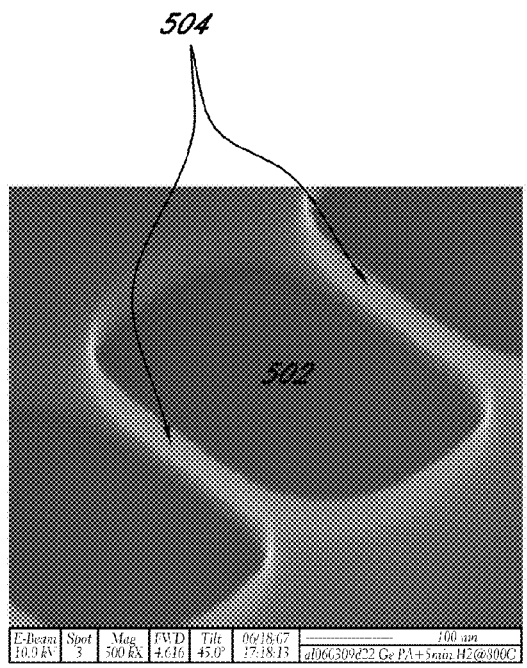
FIG. 5A
sidewall oxidation + 850C 5 min H2 anneal
FIG. 5B
Ge implant + 800C 5 min N2 anneal

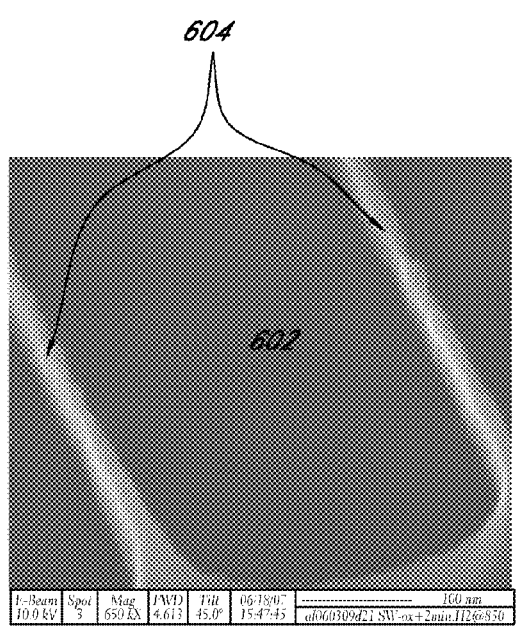 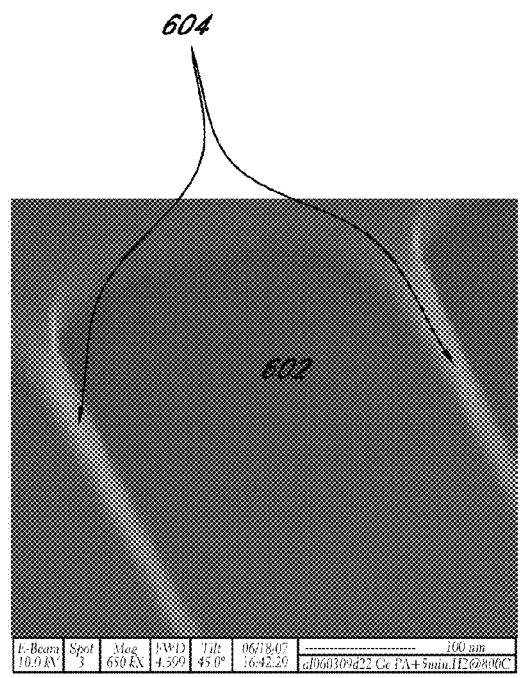
FIG. 6A
*sidewall oxidation + 850C 5 min H2 anneal*
FIG. 6B
*Ge implant + 800C 5 min N2 anneal*

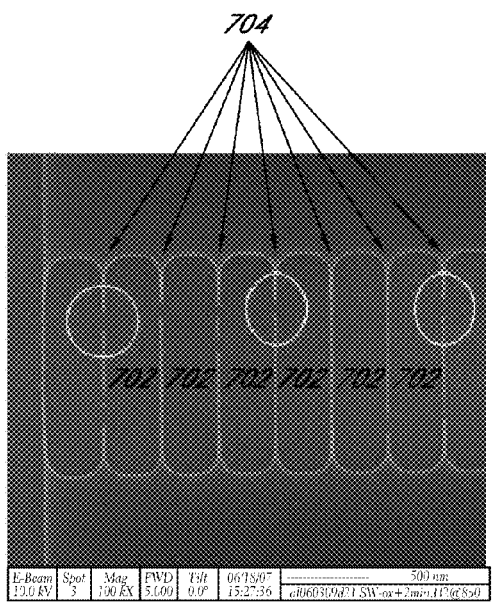
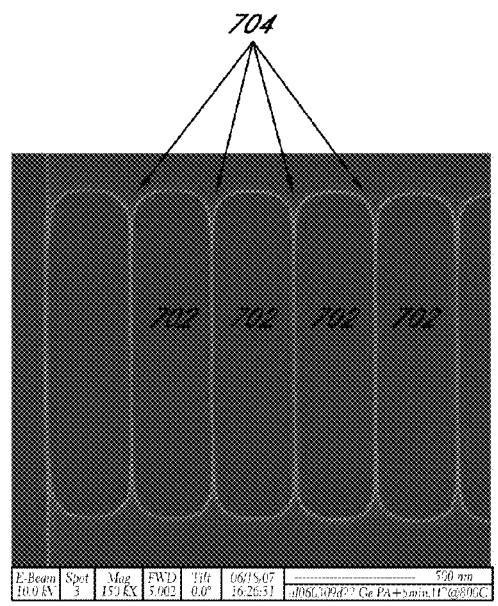
FIG. 7A
sidewall oxidation + 850C 5 min H2 anneal
FIG. 7B
Ge implant + 800C 5 min N2 anneal

METHOD FOR FABRICATING A SEMICONDUCTOR DEVICE AND THE SEMICONDUCTOR DEVICE MADE THEREOF

CROSS REFERENCE TO RELATED APPLICATIONS

This application claims priority under 35 U.S.C. §119(e) to U.S. provisional patent application 61/015,454 filed on Dec. 20, 2007, which application is hereby incorporated by reference in its entirety.

BACKGROUND OF THE INVENTION

1. Field of the Invention

The present invention generally relates to methods for manufacturing semiconductor devices. More specifically, the present invention relates to methods for enhancing the performance of semiconductor devices and the semiconductor devices obtained with the methods thereof. More particularly, the present invention also relates to methods for rounding corners and smoothing surfaces of semiconductor devices.

The present invention also relates to methods for manufacturing fin-based devices. More particularly, the present invention also relates to methods for rounding corners and smoothing surfaces of fin-based devices and the fin-based devices made thereof.

2. Description of the Related Technology

Scaling down of planar bulk CMOS devices has become a major challenge in the semiconductor industry. High channel doping, band-to-band tunneling across the junction and gate-induced drain leakage, short channel effects are some of the challenges that need to be overcome. Whereas at the beginning, device geometrical shrinking already gave a lot of improvements in IC performance, nowadays new techniques, methods, materials and device architectures have to be introduced beyond the 90 nm technology node. Multi-gate field effect transistor (MUGFET), also often referred to as fin-based semiconductor device or FINFET, is one of the promising candidates for further scaling down to 32 nm or less. Due to their three dimensional architecture, with the gate electrode wrapped around a thin semiconductor fin, an improved gate control (and thus less short channel effects) over the channel could be achieved by using multiple gates. Depending on the shape of the gate electrode, different types of MUGFETs can be defined. A double-gate finfet is a multi-gate device where the gate electrode only controls the conductivity of the two sidewall surfaces of the fin. Such a device is also often referred to as a double-gate device. An omega-gate finfet (Ω-gate finfet) is a multi-gate device where the gate controls the conductivity of the two sidewall surfaces and the top surface of the fin. An U-gate finfet is a multi-gate device where the gate controls the conductivity of the two sidewall surfaces and the bottom surface of the fin. A round-gate finfet is a multi-gate device where the gate controls the conductivity of the two sidewall surfaces, the top surface of the fin and the bottom surface of the fin. However with the introduction of MUGFETs, new problems arise.

One problem is related to the etching of the fin structures (typically done in the patterning process of the fins). Whereas for planar bulk CMOS devices current conducts on the top surface of the semiconductor wafer,—depending on the type of MUGFET—the current in MUGFET devices takes place not only on the top surface of the device, but also along the sidewalls of the fins. The etching of the fins induces damage of the sidewall surfaces of the fin, leading to reduced carrier mobility along these surfaces. For optimal device performance the sidewalls should be as smooth as possible. The surface roughness of the sidewalls of the fin should be as small as possible.

Another problem is the corner effect. In the corners of the fin, typically with an angle of 90 degrees, the electrical fields during device operation are different than in the planar region of the device. This leads to a different threshold voltage in the corner regions of the MUGFET compared to the threshold voltage along the sidewalls of the MUGFET, resulting in a degradation of the subthreshold characteristics. Therefore, for achieving good device performance, it is desirable to eliminate as much as possible the sharp corners in the fins.

One known approach to smooth the sidewalls and to round the corners of the fin is made through a combination oxide removal and hydrogen anneal of the fins, as explained in a paper by R. J. Zaman et al. "Effect of hydrogen annealing process conditions on nano scale silicon (011) fins," Mater. Res. Soc. Symp. Proc. Vol. 872 p. 37-41 (2005). Due to the hydrogen annealing, a reflow of the atoms at the semiconductor surface of the fin will occur tending to minimize the surface energy, thus resulting in minimizing the surface area, thus resulting in rounded corners. A disadvantage of this method however is the narrow temperature/pressure window. For example, at atmospheric pressure no reflow occurs below 875 degrees Celsius while above 925 degrees Celsius silicon evaporation occurs. Three other disadvantages of this method are: the undercut at the bottom fin which will decrease the stability of narrow fins; the control of the radius of the corner rounding which is crucial for controlling the profile of narrow fins and, as a consequence from the latter disadvantage, the limitation on fin width since small fin width variations will result in discontinuous fins because of Si migration.

As such, there is a need to overcome these disadvantages mentioned in the prior art.

SUMMARY OF CERTAIN INVENTIVE ASPECTS

Certain inventive aspects relate to a method for fabricating a semiconductor device, more specifically a fin-based semiconductor device, wherein the at least one corner of the at least one fin is rounded after the migration of the semiconductor atoms of the semiconductor material via point defects.

One inventive aspect relates to a method for fabricating a semiconductor device, more specifically a fin-based semiconductor device, wherein the at least one sidewall surface of the at least one fin is smoothened (i.e. the surface roughness of the at least one sidewall surface is decreased) after the migration of the semiconductor atoms of the semiconductor material via point defects.

By using the method, a better corner rounding control can be achieved.

Another inventive aspects relate to a semiconductor device, more specifically a fin-based semiconductor device with rounded corners and/or smoothed sidewall surfaces as to achieve a better device performance.

One inventive aspect relates to a method for fabricating a semiconductor device comprising (or consisting of):

patterning at least one fin in a substrate, the substrate comprising a semiconductor material, the at least one fin comprising a top surface, at least one sidewall surface, at least one corner, creating a supersaturation of point defects in the at least one fin, then annealing and subsequently cooling down the at least one fin such that semiconductor atoms of the semiconductor material can migrate via the point defects.

The at least one sidewall surface of the at least one fin has an initial surface roughness $R_{initial}$ before the process of creating a supersaturation of point defects in the at least one fin.

The at least one sidewall surface of the at least one fin has a final surface roughness $R_{final}$ after the process of cooling down the at least one fin.

Preferably, the final surface roughness $R_{final}$ of the at least one sidewall surface of the at least one fin is smaller than the initial surface roughness $R_{initial}$ of the at least one sidewall surface of the of the at least one fin.

The at least one corner of the least one fin has an initial radius of curvature $RC_{initial}$ before the process of creating a supersaturation of point defects in the at least one fin.

The at least one corner of the least one fin has a final radius of curvature $RC_{final}$ after the process of cooling down the at least one fin.

Preferably, the final radius of curvature $RC_{final}$ of the at least one corner of the least one fin is larger than the initial radius of curvature $RC_{initial}$ of the at least one corner of the at least one fin.

More preferably, the final radius of curvature $RC_{final}$ of the at least one corner of the at least one fin having a fin width W is smaller than half of the fin width (being W/2).

Otherwise the, the final radius of curvature $RC_{final}$ should not become larger than half of the fin width.

In one aspect, creating the supersaturation of point defects comprises passing at least one beam through (the material or the thickness of) the at least one fin, the beam comprises electrically inactive species.

More preferably, the electrically inactive species comprise preferably any of germanium, silicon, or carbon.

The electrically inactive species (or ions) of the at least one beam are implanted in an insulating region after the passing through the at least one fin.

Preferably, at least part of the electrically inactive ions of the at least one beam are implanted in an insulating region after the passing through the at least one fin.

Preferably, the insulating region is located under the at least one fin, i.e. under the semiconductor material of the at least one fin.

Preferably, the insulating region is located aside of the at least one fin, i.e. aside of the semiconductor material of the at least one fin.

The point defects preferably comprise vacancies.

Preferably, the supersaturation of point defects comprises a supersaturation of vacancies.

Preferably, a supersaturation of point defects (or vacancies) is defined by a concentration of point defects (or vacancies) which is larger that a concentration of point defects (or vacancies) at thermodynamic equilibrium.

More preferably, the supersaturation of point defects (or vacancies) is defined by a concentration of point defects (or vacancies) being larger than a initial concentration of point defects (or vacancies) (i.e. the concentration of point defects (or vacancies) before the process of creating a supersaturation of point defects (or vacancies)).

Passing the at least one beam through (the material or the thickness of) the at least one fin may be performed under an angle α with respect to the top surface of the at least one fin.

Preferably, the angle α is equal to 0 degrees, the at least one beam is coming in at the top surface of the at least one fin.

Preferably, the angle α with respect to the top surface of the at least one fin is different from 0 degrees.

More preferably, the angle α with respect to the top surface of the at least one fin is smaller than about 90 degrees.

Even more preferably, the angle α with respect to the top surface of the at least one fin is smaller than or equal to about 45 degrees.

Preferably, the angle α is different from 0 degrees, the implanted ion beam is coming in at the at least one sidewall surface of the at least one fin.

Passing the at least one beam through (the material or the thickness of) the at least one fin may further comprise passing a second beam through (the material or the thickness of) the at least one fin under an angle β with respect to the top surface of the at least one fin, the second beam coming in at an opposite sidewall of the fin of the at least one sidewall of the fin.

Preferably, the angle β is equal but opposite to the angle α (or β=−α).

The annealing of the at least one fin may be performed in an inert ambient.

Preferably, annealing the at least one fin comprises annealing with an inert (or not reactive) gas.

More preferably, the inert gas comprises any of nitrogen, argon, helium, or neon.

Preferably, annealing the at least one fin is performed at a temperature in the range of about 700 to 900 degrees Celsius, depending on the cool down after the annealing process.

After the annealing process (i.e. annealing and subsequently cooling down) the at least one corner of the at least one fin is rounded (i.e. the radius of curvature of the at least one corner is increased) and/or the at least one sidewall surface of the at least one fin is smoothened (i.e. the surface roughness of the at least one sidewall surface is decreased).

The annealing process is done after the creation of the supersaturation of point defects.

Annealing the at least one fin may be performed using a lamp anneal.

When lamp annealing is used, the raising or lowering of the temperature during the annealing process is performed in a very short time.

Annealing the at least one fin may be performed using a furnace anneal.

When furnace annealing is used, the raising or lowering of the temperature during the annealing process is performed in a longer time compared to using lamp annealing, otherwise the, the cooling rate is much slower using furnace annealing compared to using lamp annealing.

For furnace annealing the cooling rate is preferably in the range of about 5 degrees Celsius to 10 degrees Celsius per minute between about 800 degrees Celsius and 500 degrees Celsius.

The process of cooling down may be performed at a cooling rate lower than about 15 degrees Celsius per minute.

Patterning at least one fin may further comprise providing an array of at least a first fin located at a fin pitch from at least another fin.

The substrate may be a semiconductor-on-insulating substrate.

It is an advantage of certain embodiments that the device performance of a multi-gate device is improved.

It is an advantage of certain embodiments of the present invention that the thermal budget, i.e. the temperature used during the annealing process, is reduced.

It is another advantage of certain embodiments that lower temperatures can be used for the annealing process compared to the temperatures used in the prior art where no supersaturation of point defects (for example an excess of vacancies) is created in the at least one fin.

Lower temperatures can be used due to the fact that the supersaturation of point defects (for example the excess of vacancies) created in the at least one fin enhances the semiconductor surface mobility in the fin.

It is another advantage of certain embodiments of the present invention that the thermal budget window, i.e. the temperature used during the annealing process, is broader than the thermal budget window mentioned in prior art (i.e. in prior art in between 875 degrees Celsius and 925 degrees Celsius compared to about 700 degrees Celsius to 900 degrees Celsius).

It is an advantage of certain embodiments that sidewall smoothing is obtained independent from the orientation of the structures on the wafer (standing for (100) and (110) exposed crystal planes).

It is an advantage of certain embodiments that the cleaning process prior to the annealing process is minimized.

It is a further advantage of certain embodiments that the box recess, i.e. the undercut at the bottom of the fin, is reduced.

It is a further advantage of certain embodiments of the present invention that the stability for narrow fins (more specifically for fins with a fin width below 10 nm) is enhanced.

It is an advantage of certain embodiments that the corner(s) of the fin may be rounded and as a consequence device performance of the fin-based semiconductor device is enhanced It is an advantage of certain embodiments that the surface roughness of the patterned (or etched) fin may be reduced and as a consequence device performance of the semiconductor device comprising such a fin is enhanced.

According to another inventive aspect a multi-gate device is disclosed obtainable by the methods described in certain embodiments.

Another inventive aspect relates to a multi-gate device obtainable by a method described herein.

Although there has been constant improvement, change and evolution of devices in this field, the present concepts are believed to represent substantial new and novel improvements, including departures from prior practices, resulting in the provision of more efficient, stable and reliable devices of this nature.

BRIEF DESCRIPTION OF THE DRAWINGS

All drawings are intended to illustrate some aspects and embodiments of the present invention. The drawings described are only schematic and are non-limiting. In the drawings, the size of some of the elements may be exaggerated and not drawn on scale for illustrative purposes. In the different figures, the same reference signs refer to the same or analogous elements.

Exemplary embodiments are illustrated in referenced figures of the drawings. It is intended that the embodiments and figures disclosed herein be considered illustrative rather than restrictive FIGS. 1A to 1D gives a schematic representation of different processes according to certain embodiments of the present invention for manufacturing a semiconductor device.

FIGS. 5A and 5B show SEM images at a tilt angle of 45 degrees of a plurality of fins using standard corner rounding process (FIG. 5A) in comparison with smoothing and corner rounding process according to certain embodiments of the present invention (FIG. 5B).

FIGS. 6A and 6B show zoomed SEM images of FIGS. 5A and 5B respectively.

FIGS. 7A and 7B show SEM images of a plurality of fins using standard corner rounding process (FIG. 7A) in comparison with smoothing and corner rounding process according to certain embodiments of the present invention (FIG. 7B).

DETAILED DESCRIPTION OF CERTAIN ILLUSTRATIVE EMBODIMENTS

Figure 1A:
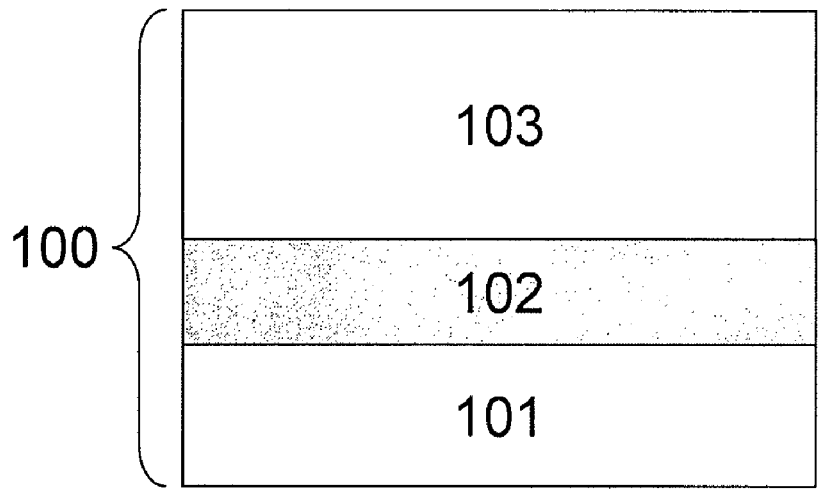

One or more embodiments of the present invention will now be described in detail with reference to the attached figures, the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention. Those skilled in the art can recognize numerous variations and modifications of this invention that are encompassed by its scope. Accordingly, the description of certain embodiments should not be deemed to limit the scope of the present invention.

Furthermore, the terms first, second and the like in the description are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein. For example "underneath" and "above" an element indicates being located at opposite sides of this element.

It is to be noticed that the term "comprising", used in the claims, should not be interpreted as being restricted to the means listed thereafter; it does not exclude other elements or processes. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. As the following claims reflect, inventive aspects lie in less than all features of a single foregoing disclosed embodiment.

In the description provided herein, numerous specific details are set forth. However, it is understood that embodiments of the invention may be practiced without these specific details. In other instances, well-known methods, structures and techniques have not been shown in detail in order not to obscure an understanding of this description.

The following terms are provided solely to aid in the understanding of the description.

The term "supersaturation" as referred to in this application is used to define an excess concentration of point defects in a semiconductor material, more preferably an excess concentration of vacancies in the semiconductor material.

In thermal equilibrium of a crystal (e.g., a Si crystal), a certain number of vacancies are always present in an otherwise perfect crystal. This concentration of vacancies at thermal equilibrium is denoted as $C_{V@EQ}$.

There is a supersaturation of point defects (for example vacancies) if the available concentration of point defects (for example vacancies, $C_V$) is larger than the concentration of point defects at the thermodynamic equilibrium (for example vacancies, $C_{V@EQ}$).

Otherwise the, there is a supersaturation of point defects (for example vacancies) when the available concentration of point defects (for example vacancies, $C_V$) divided by the concentration of point defects at the thermodynamic equilibrium (for example vacancies, $C_{V@EQ}$) is higher than 1.

Figure 11:
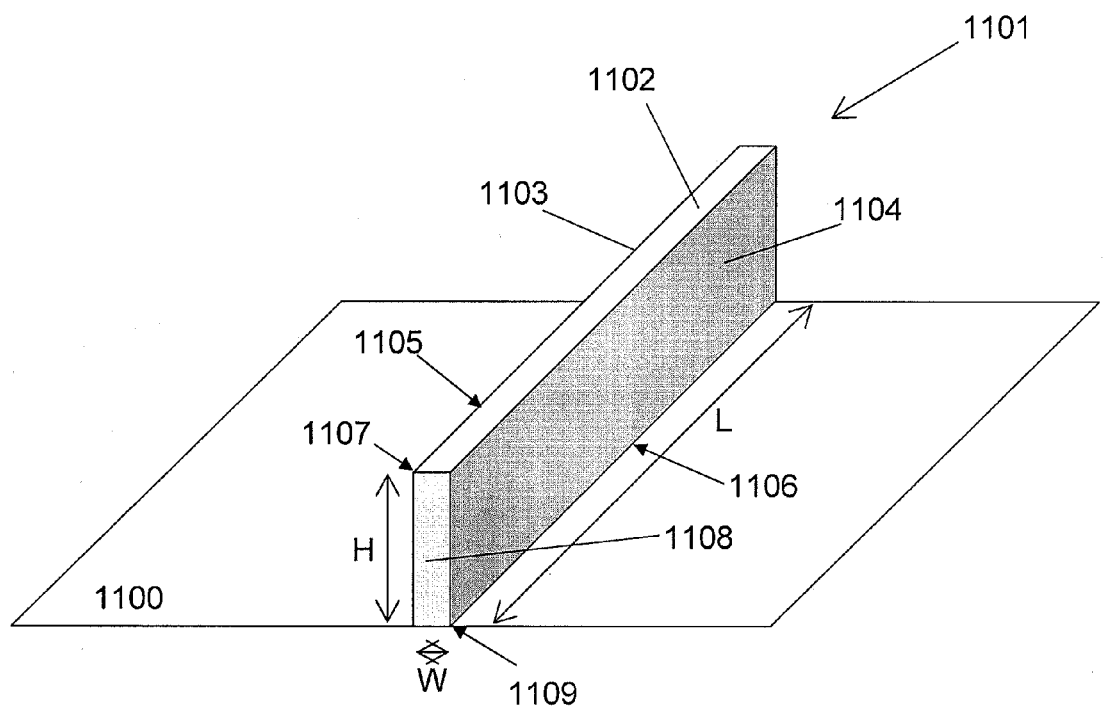
FIG. 11 is a schematic representation of a 3-dimensional view of a fin.

As shown in FIG. 11, the fin 1101 is raised above the wafer/substrate surface 1100. The geometry of the fin 1101 is determined by its width W, height H and length L and comprises a top surface 1102, a first (or left) sidewall surface 1103, a second (or right) sidewall surface 1104 and a front surface 1108.

The term "corner" as referred to in this application is used to define the corner of a fin-based device (1105, 1106, 1107, 1109 in FIG. 11).

A corner may be the position at which at least two surfaces meet and form an angle.

A corner of a fin 1105 (of a finfet or multi-gate device) may thus be any position where a sidewall surface of the fin and the top surface of the fin meet.

A corner of a fin 1106 (of a finfet or multi-gate device) may thus also be any position where a sidewall surface of the fin and the bottom surface of the fin meet.

A corner of a fin may be the position at which three surfaces meet and form an angle.

In FIG. 11 a corner of a fin may be for example corner 1107 where front surface, sidewall surface and top surface meet or corner 1109 where front surface, sidewall surface and bottom surface meet.

The amount of rounding of a corner can be defined by its radius of curvature RC, the radius of curvature having a value higher or equal to 0. If the angle of the corner is 90 degrees, i.e. a right angle (and thus a non-rounded angle), the radius of curvature is 0 (or RC=0). A higher amount of rounding of the corner, i.e. a more rounded corner, results in a higher radius of curvature (or RC>0) for this corner.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

A first embodiment relates to a method for fabricating a semiconductor device. The method for fabricating a semiconductor device comprises:
  patterning at least one fin in a semiconductor material, the fin comprising a top surface, at least one sidewall surface, at least one corner,
  creating a supersaturation of point defects in the at least one fin, and
  annealing and subsequently cooling down the at least one fin such that semiconductor atoms of the semiconductor material can migrate via the point defects.

Referring to FIG. 1A to FIG. 1D, each of these processes will now be described in more detail.

In a first process of the method for fabricating a semiconductor device at least one fin 104 is patterned in a substrate 100 comprising a semiconductor material 103 (FIG. 1A).

The starting material is preferably a substrate 100 comprising a semiconductor material 103. The substrate preferably comprises a semiconductor-on-insulator substrate. A semiconductor-on-insulator substrate comprises a semiconductor layer 103 on top of a buried oxide layer (BOX) 102, the buried oxide layer 102 positioned on top of a semiconductor handle wafer 101. The semiconductor-on-insulator substrate may be a silicon-on-insulator substrate (SOI). SOI substrates can be manufactured in different ways, such as separation by implanted oxygen (IMOX) or wafer bonding. Also strained silicon-on-insulator substrates (SSOI) or relaxed $Si_{1-x}Ge_x$-on-insulator (SGOI) or strained silicon directly on insulator (SDOI) or a thin film SOI (to manufacture a thin film fully depleted SOI semiconductor device) can be used.

A fin-based semiconductor device is also often referred to as finFET or multi-gate device (MUGFET).

Figure 2A:
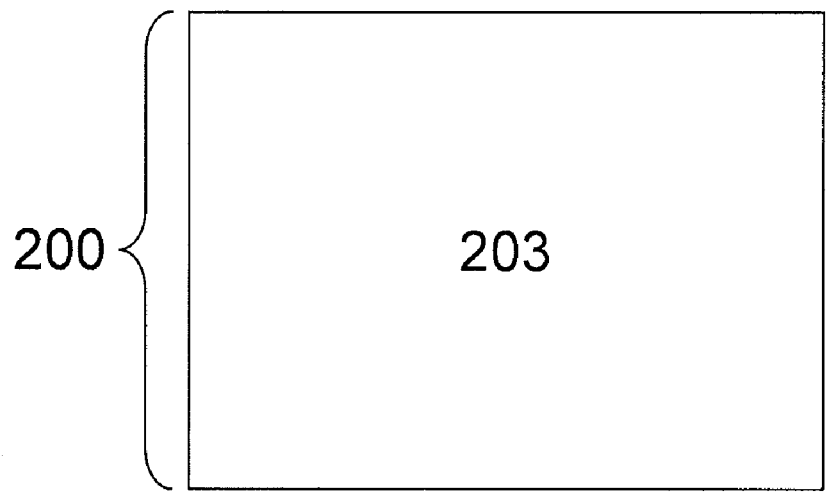
FIGS. 2A to 2D gives a schematic representation of different processes according to alternative embodiments of the present invention for manufacturing a semiconductor device.

The substrate may also be a bulk substrate 200 comprising the semiconductor material 203 (FIG. 2A). For the latter the multi-gate device fabricated thereof is referred to as a bulk MUGFET or bulk finFET.

The semiconductor material 103 may be chosen from any crystalline (mono-crystalline or poly-crystalline) semiconductor material such as for example Si, SiGe, SiC.

Figure 1B:
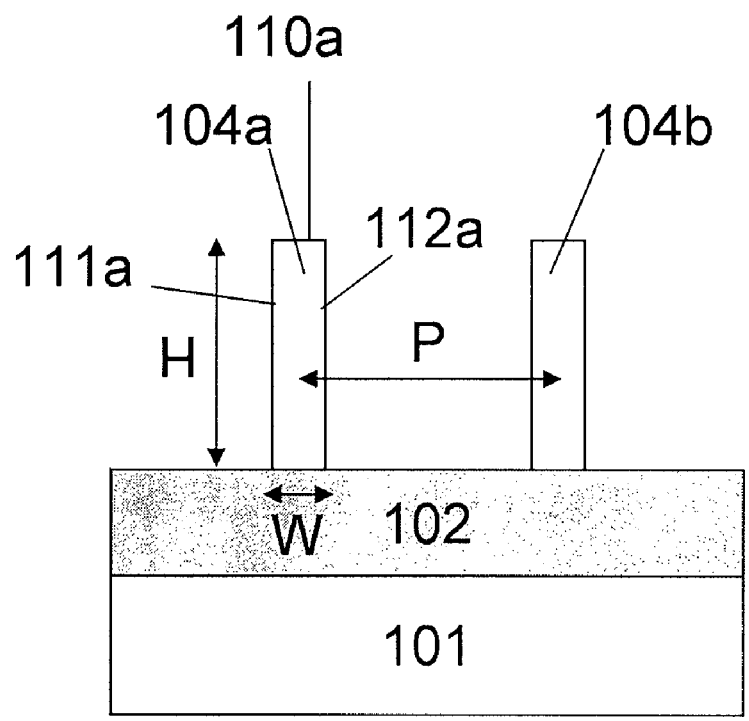

The at least one fin 104 is patterned in the semiconductor material 103 by using a photolithographic process or by using spacer technology for patterning spacer defined fins or by any other patterning technique as generally known for a person skilled in the art (FIG. 1B).

In another embodiment of the present invention a plurality of fins may be patterned.

At least two fins need to be patterned to form an array of fins.

The plurality of fins comprises at least a first fin 104a located at a fin pitch P from at least another fin 104b.

The fin pitch P is defined as the center-to-center distance between two neighboring fins.

At this point, all the fins 104 comprise the semiconductor material 103.

The fins may be electrically isolated from each other by an insulating region 102.

In case of using a semiconductor-on-insulator substrate (FIG. 1B), the BOX layer 102 acts as the insulating layer in between the fins 104a, 104b. Each fin is thus electrically isolated from other fins by virtue of the BOX layer underneath the fins.

Any electrically insulating material is suitable for the insulating region, such as for example siliconoxide, siliconnitride, . . . .

The insulating layer is typically $SiO_2$ with a thickness of, for example 145 nm, but not limited thereto.

Figure 2B:
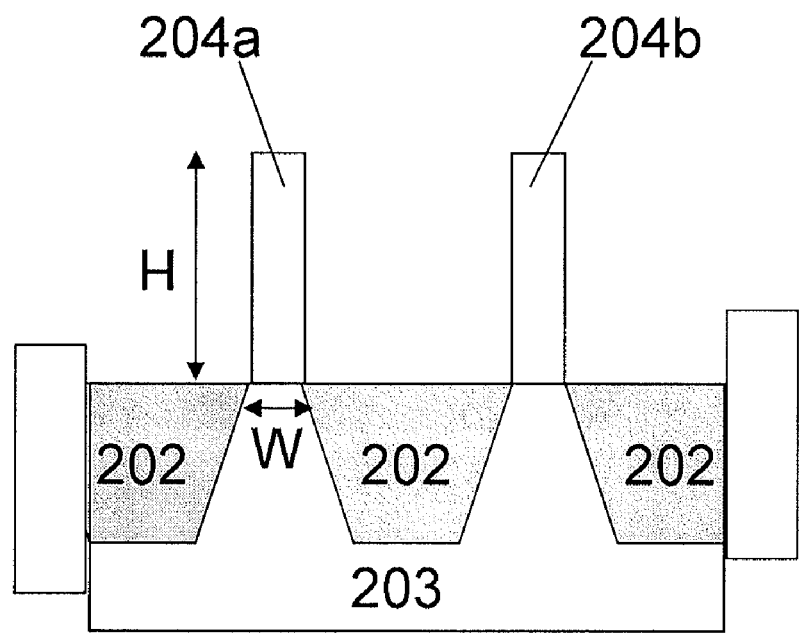

In case of using a bulk substrate 200 (FIG. 2A), an insulating region 202 may be provided in between the fins 204a, 204b into the bulk semiconductor material 203 (FIG. 2B).

Different possibilities to do so are known for a person skilled in the art, such as for example shallow trench isolation (STI) or such as for example oxidizing the semiconductor material 203 (from the bulk substrate 200) in between the fins 204a, 204b as to form electrically isolating regions 202 in between the fins 204a, 204b.

The insulating regions 202 are in this case thus only present in between the fins 204a, 204b and not underneath the fins 204a, 204b.

Each fin 104a, 104b, 204a, 204b has a fin width W, a fin height H. The width W and the height H of the fins are depending on the technology node.

The fin width W determines the short-channel effects, among other things.

The fin height H determines the fin's topography and the layout efficiency, among other things.

For example for 32 nm technology node, the width W of the fin is preferably chosen within a range of about 5 nm to 100 nm, more preferably narrow fins with a fin width below about 50 nm, even more preferably a fin width below about 10 nm; the height H of the fin is chosen within a range of about 10 nm to 100 nm; the fin pitch P in between adjacent fins may be chosen within a range of about 30 nm to 300 nm.

Each fin has a fin length L (not shown).

Each fin comprises a top surface 110a and at least a sidewall surface, more specifically two sidewall surfaces 111a, 112b. The two sidewall surfaces of each fin consist of a first (or left) sidewall surface 111a and a second (or right) sidewall surface 112a.

Figure 1C:
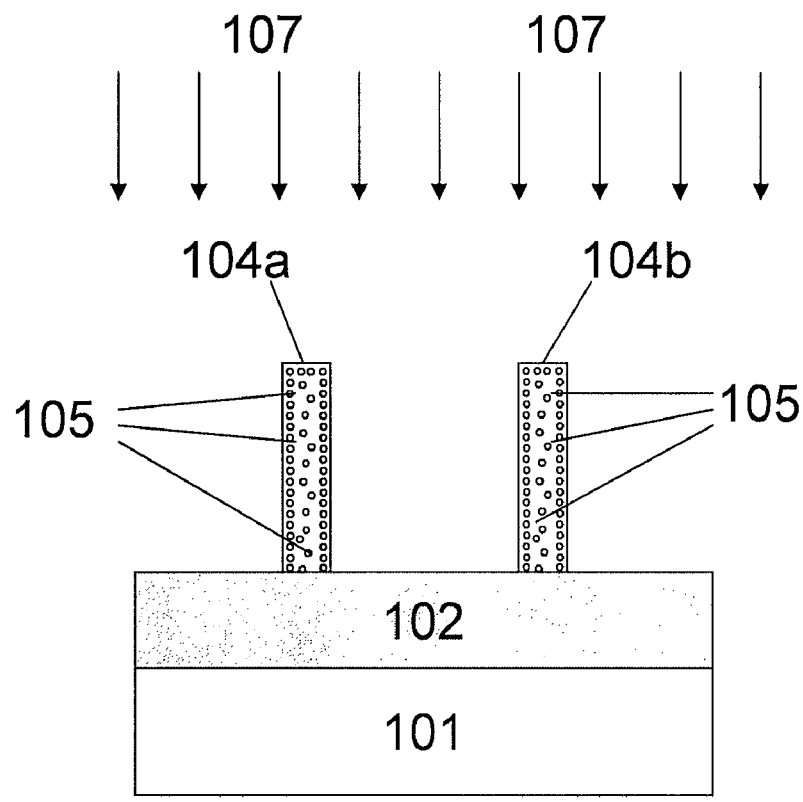
Figure 1D:
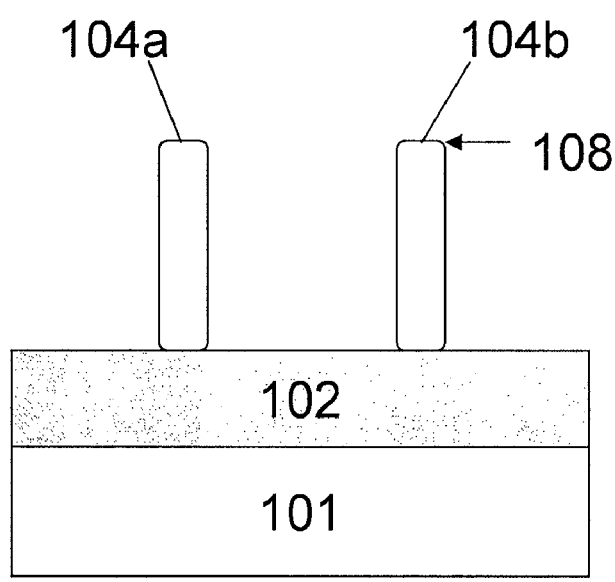
Figure 2C:
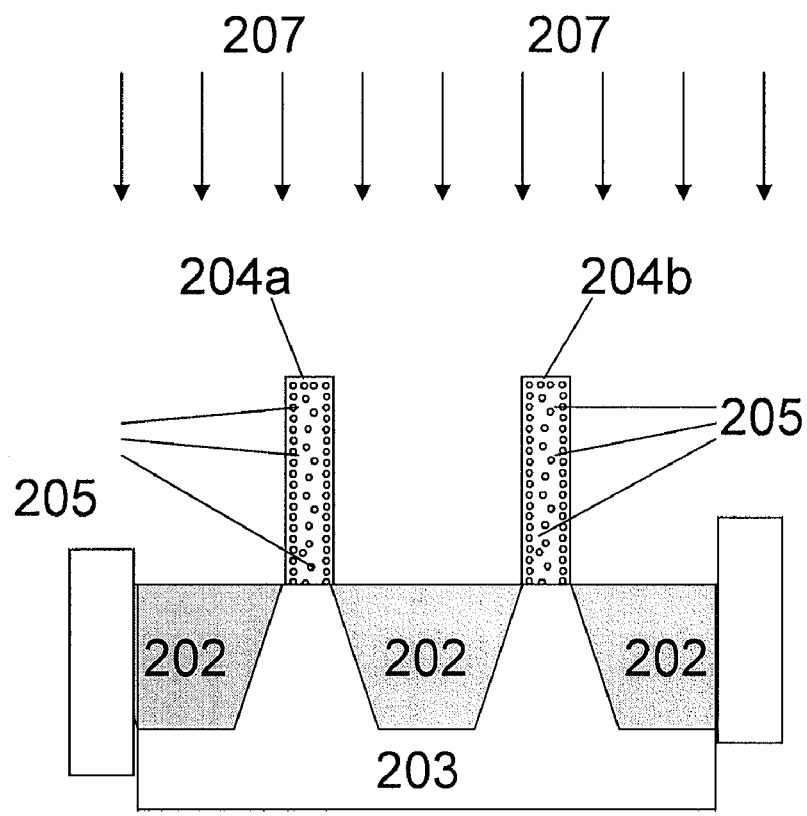
Figure 2D:
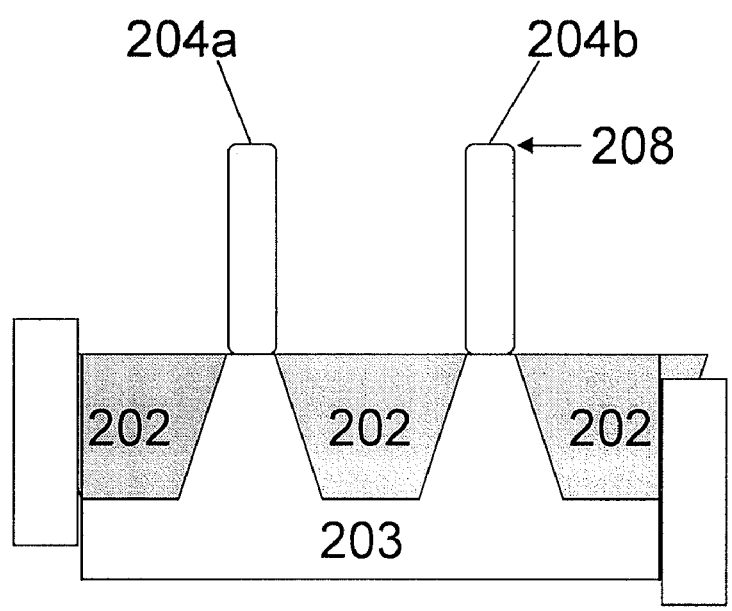

In a next process of a method of one embodiment, a supersaturation of point defects 105, 205 is created in the at least one fin 104, 204 (FIG. 1C, FIG. 2C).

The point defect is preferably a vacancy.

A vacancy is a point defect; otherwise the, a vacancy is an imperfection resulting from an unoccupied lattice position in the crystal lattice of the material; otherwise the, the vacancies are missing atoms in a crystal structure.

Vacancies are also often referred to as Schottky defects. The equilibrium number of vacancies $C_{V@EQ}$ is proportional to the Boltzmann factor $k_B$ and to the temperature T:

$$C_{V@EQ} \approx \exp(-E_V/k_B T),$$

where $E_V$ is the energy required to take an atom from a lattice site, T is the temperature and $k_B$ is the Boltzmann factor.

A vacancy may be a monovacancy or may be a divacancy, i.e. a pair of vacancies.

The diffusion of a vacancy in one direction is equivalent to the diffusion of an atom in the opposite direction. Thus, a vacancy may move when a neighboring atom or ion moves to occupy the vacant site. The vacancy will then shift in the opposite direction to the site that was the source of the atom or ion. This diffusion mechanism is also known as vacancy-assisted diffusion.

The supersaturation of point defects, more specifically of vacancies may also be referred to as an excess of vacancies or a sur-saturation of vacancies.

The concentration of vacancies is dependent on the temperature.

In silicon, for example, the concentration of vacancies at thermal equilibrium is typically about $5e11/cm^3$ (depending on the quality of the c-Si growth).

After the process of creating an excess of vacancies, the concentration of vacancies for silicon, for example, may be increased to a range of several order of magnitude depending on dose/energy of the ion implant process.

Otherwise the, the supersaturation of point defects (e.g. vacancies) is defined by a larger concentration of point defects (e.g. vacancies) compared to the concentration of point defects (e.g. vacancies) at thermodynamic equilibrium.

Otherwise the, the supersaturation of point defects (e.g. vacancies) is defined by a larger concentration of point defects (e.g. vacancies) compared to the initial concentration of point defects (e.g. vacancies) (i.e. before the process of creating a supersaturation of point defects (e.g. vacancies)).

Figure 3A:
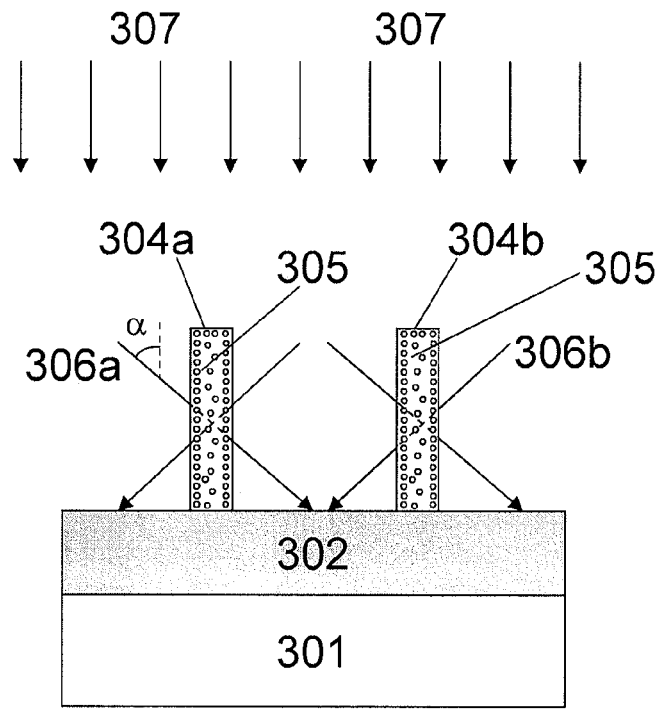
FIGS. 3A to 3C gives a schematic representation of a particular process, i.e. the creation of a supersaturation of point defects, according to certain embodiments of the present invention for manufacturing a semiconductor device.

In one embodiment of the present invention creating the supersaturation of vacancies 305 comprises passing at least one beam 306a, 306b, through the at least one fin 304a, 304b (FIG. 3A).

The at least one beam 306a, 306b comprises electrically inactive species.

More specifically the at least one beam is an ion beam comprising electrically inactive ions of a material, such as for example Si ions, Ge ions, C ions, H ions, Xe ions but not limited thereto.

The beam acts as a source for introducing impurities into (the semiconductor material of) the at least one fin 304a, 304b.

The ions of the beam may set target atoms of the semiconductor material in the fin into motion, which travel some distance in the target (also often referred to as recoils). On their way, they may generate other recoils; these may again generate recoils and so on. The recoils may leave behind a vacancy when they are produced, and may form an interstitial when they come to rest.

According to certain embodiments of the present invention the at least one beam 306a, 306b may generate an excess of vacancies 305 in the fin 304a, 304b.

In one embodiment of the present invention, the ion beam 306a, 306b, 306c passes through the at least one fin 304a, 304b, such that the ions are not implanted into the at least one fin 304a, 304b or into the surrounding, nearby semiconductor material 303, such as for example the semiconductor material of a neighboring fin. Therefore the ions are preferably electrically inactive species. The beam 306a, 306b, 306c is thus targeted onto the at least one fin 304a, 304b whereby the incoming ions pass through the material of the fin 304a, 304b. The incoming ions are essentially not implanted into (or inside) the fin 304a, 304b, but will leave the fin 304a, 304b after passing through the thickness of the fin 304a, 304b. Only a very residual concentration (i.e. typically below about 10% of the incoming dose, typically below about 5% of the incoming dose) of the electrically inactive ions may be present in the fin 304a, 304b after passing the beam 306a, 306b. By passing the ion beam 306a, 306b, 306c through the at least one fin 304a, 304b, point defects 305 are created in the fin 304a, 304b.

The ions of the ion beam 306a, 306b, 306c penetrate the semiconductor material of the fin 304 loosing their energy in the collisions with the target atoms until they come to rest. The distance traveled, or the penetration depth, is a function of the kinetic energy of the ions (and of the composition of the target material, i.e. the semiconductor material of the fin). As this can be precisely controlled (via the electrostatic field, i.e. ion beam energy and/or ion beam dose and/or ion beam tilt angle), methods according to embodiments of the present invention allow the ion beam 306a, 306b, 306c to pass through the at least one fin and thus having the ions implanted in a material different from the semiconductor material, more specifically different from the semiconductor material of the fin 304a, 304b.

More specifically by choosing an appropriate ion beam energy, ion beam dose, and/or ion beam tilt angle α, a supersaturation of vacancies 305 may be created in the fin 304a, 304b due to the incoming (and passing) ions. Additionally also a small amount of interstitials may be created in the fin.

The ion beam energy and dose should be chosen such that the interstitials are spatially separated from the vacancies. As a consequence part of the interstitials will be ejected out of the fin, leaving a high amount of vacancies 305 in the fin 304a, 304b in comparison with the amount of interstitials left in the fin 304a, 304b.

Due to the ion implantation process a sur-concentration of vacancies 305 is thus created in the fin 304a, 304b compared to the interstitials in the fin.

The vacancies 305 may be created preferably at the surface of the fin, i.e. close to the sidewall and top surfaces of the fin. Otherwise the, the sidewall surfaces of the fin are rich in vacancies.

Depending on the chosen ion beam energy and/or ion beam dose and/or ion beam tilt angle α also vacancies may be created much deeper in the fin, i.e. inside the fin, but far away from the sidewall and top surfaces of the fin. The ion beam energy and/or ion beam dose and/or ion beam tilt angle should be chosen such that its penetration depth is deeper than the distance the ions need to overcome to be able to pass through the fin.

Figure 3B:
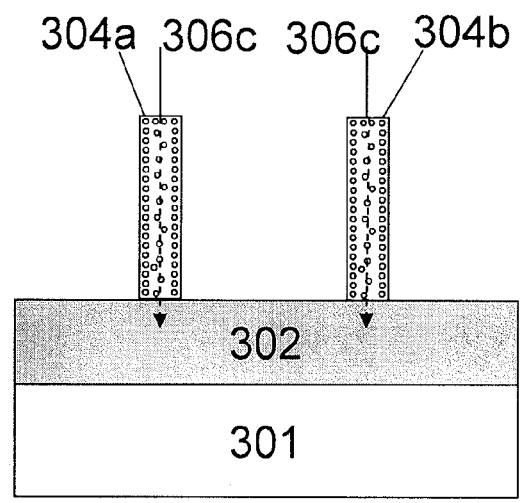

In an embodiment of the present invention the beam 305 is passing through the at least one fin under an angle α with respect to the top surface of the at least one fin 304a, 304b (FIG. 3A, 3B).

In one embodiment the angle α is different from 0 degrees (FIG. 3A). When an angle α different from 0 degrees is used, this means the beam provides tilted implantation of the electrically inactive species. The ion beam 306a will in this case first hit a left sidewall surface of the fin or the ion beam 306b will in this case first hit a right sidewall surface of the fin, travel through the fin and leave the fin at the opposite sidewall surface of the fin.

When the angle α is equal to 0 degrees, a vertical implantation beam 306c is passing through the fin (FIG. 3B). The ion beam will in this case first hit the top surface of the fin, travel through the fin and leave the fin at the opposite surface, i.e. the bottom surface of the fin.

If a tilted ion beam implantation (i.e. α different from zero degrees) is used, preferably two implantation processes are performed. One tilted implantation process with a tilt angle α and another implantation process with an opposite and preferably equal tilt angle −α. The one tilted implantation process will mainly create vacancies 305 at the first sidewall surface and top surface of the at least one fin, whereas the other implantation process will mainly create vacancies at the opposite sidewall surface and top surface of the at least one fin.

In one preferred embodiment of the present invention the electrically inactive ions of the beam 306a, 306b, 306c are implanted in the insulating region 302 after passing through the at least one fin 304a, 304b.

Figure 3C:
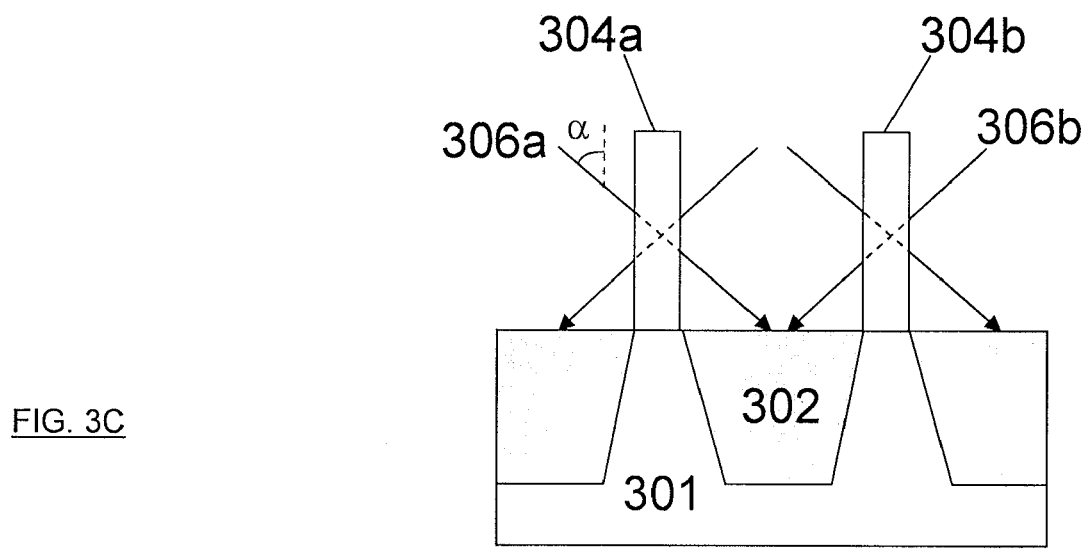

The insulating region 302 may be located aside of the at least one fin (FIG. 3A, 3B, 3C).

Alternatively the insulating region may also be located under the at least one fin (FIG. 3A, 3B).

If for example the at least one fin is patterned in a semiconductor-on-insulator substrate, the insulating layer, more specifically a buried-oxide-layer (BOX) is present under and aside of the fin or plurality of fins.

As shown in FIGS. 3A and 3B, if a semiconductor-on-insulator substrate is used, the ions are implanted into the BOX 302 after passing through the fin.

As illustrated in FIG. 3A, the ion beam is passing through the fin, finally hitting into the insulating region (or BOX) aside of the fin, if an implantation angle different from zero degrees is used (FIG. 3A).

In case a plurality of fins is used, the ion beam will hit the insulating layer (or BOX) in between the fins. The electrically inactive species of the ion beam will thus be implanted in the insulating region.

If an implantation angle of zero degrees is used (FIG. 3B), the electrically inactive species are implanted into the BOX area located underneath the fin.

If for example the at least one fin is patterned in a bulk semiconductor substrate (also referred to bulk finFET), such as for example Si, an insulating region is only provided aside of the at least one fin (FIG. 3C). Typically a shallow trench isolation (STI) is provided to isolate the fins or a plurality of fins from each other. If the insulating layer is not present underneath the fin, it is difficult or even not possible to vertically implant the ion beam into the insulating layer, i.e. using a tilt angle equal to zero degrees, since this would result in implantation of the bulk semiconductor material with the ions underneath or at the bottom of the fin, which is not advantageous for the performance of the multi-gate device fabricated thereof.

The angle of the ion beam should thus be chosen such that the ions of the ion beam are implanted in an insulating layer after passing through the fin.

If an ion beam is targeted onto a plurality of fins, the tilt angle α may be chosen dependent on the geometry of the fins, i.e. depending on the fin height, fin width and fin pitch. For example for a greater fin pitch a greater implantation angle may be chosen compared to a smaller fin pitch.

Also the ion beam energy and dose may be chosen dependent on the geometry of the fin, i.e. depending on the fin height, fin width and fin pitch. For example for an implantation angle different from zero degrees, for a wider fin a higher ion beam energy and/or ion energy dose may be chosen compared to a smaller fin, since a higher penetration depth into the fin needs to be crossed. For example for an implantation angle equal to zero degrees, for a higher fin a higher ion beam energy and/or ion energy dose must be chosen compared to a lower fin, so that the ion beam is passing through the fin.

The energy and/or dose of the ion beam should be chosen such that the incoming ions pass through the fin and are implanted into the insulating region.

The energy and/or dose of the beam should also be chosen high enough such that an excess of vacancies may be created in the fin.

In one embodiment ion energies in a range of about 5 keV to 250 keV, in a range of about 5 keV to 100 keV, in a range of about 5 keV to 50 keV may be used, these high energies enabling the ions to create structural damage in the semiconductor material of the fin, i.e. to create point defects. If the energy of the ion beam is chosen too low, the structural damage will be negligible as well as the penetration depth of the ions will not be sufficient.

The energy of the ion beam should be high enough such that the ions pass through the fin, otherwise the, the energy of the ion beam should be such that the penetration depth is larger than the distance the ions need to overcome to pass the fin.

The penetration depth of the ions is also depending on the atomic weight of the ions.

It will be understood by those having skill in the art that lighter ions such as for example silicon Si (atomic weight=28.09) typically penetrate the substrate to a greater depth than heavier ions such as for example germanium Ge (atomic weight=72.60), for a given implant dose. Otherwise the, in order to pass the fin a higher energy and/or dose is necessary when using a Ge ion beam compared to the energy and/or dose when using a Si ion beam.

The implanted dose and/or energy and/or tilt angle of the species should also be selected such that the numbers of interstitials in the fin is minimized.

The implanted dose and/or energy of the species should also be selected such that the amount of crystalline point defects is kept under the amorphization threshold. Otherwise the, the implanted dose and/or energy is selected such that the crystalline semiconductor material has not turned into amorphous semiconductor material after the ion implantation process, for example such that crystalline Si is not transformed into amorphous Si (or a-Si).

In a next process of a method of one embodiment, the at least one fin is annealed such that the semiconductor atoms of the semiconductor material can migrate via the point defects, more specifically via the vacancies (FIG. 1C, FIG. 2C).

In one embodiment the annealing process is performed with an inert gas, i.e. in an environment comprising an inert gas. The inert gas may comprise nitrogen ($N_2$), argon (Ar), helium (He), neon (Ne), but not limited thereto.

Due to the anneal in an inert gas (or in inert ambient) and in presence of an excess of point defects, a vacancy-assisted diffusion will occur in the semiconductor fin. The vacancy and interstitial-rich surface of the fin will enhance the semiconductor migration at the surface and thus also the smoothing of the surface and corner rounding 108, 208 of the fin. During this vacancy-assisted diffusion semiconductor atoms from the semiconductor material from the fin will hop from one vacancy to another. Due to the large amount of point defects, more specifically the supersaturation of vacancies, the diffusion mechanism is enhanced compared to a situation where only a small amount of point defects would be present, thus to a situation where no supersaturation of vacancies is present in the fin.

Depending on the depth of the vacancy rich regions the temperature of the annealing process in inert gas (or inert ambient) may be chosen in a range of about 650 degrees Celsius to 950 degrees Celsius.

The time of the annealing process in inert gas (or in inert ambient) is related to the depth of the vacancy rich regions. The diffusion from the interior to the surface takes time and is limited by how fast the vacancies can be transported there.

After the annealing process the at least one fin is cooled down. The cooling rate is important for the clean out of vacancies by transport to the surfaces. Since there are not enough interstitials around to fill all the vacancies, the vacancies have to diffuse to the surface to recombine with interstitials. As a wafer, i.e. the at least one fin, i.e. the semiconductor device, cools from high temperatures, it tries to keep up with its ever-changing equilibrium state. At lower temperatures, equilibrium requires lower concentrations of vacancies and interstitials. If the cooling rate is very slow—such as is always the case with furnace heat treatments—then effectively all of the excess vacancies are cleaned out of semiconductor body. i.e. the fin, through the surfaces. The semiconductor interstitials with the highest energy (highest number of dangling bonds) will migrate first which results in smoother sidewalls and rounded corners of the fin.

The cooling rate is preferably lower than about 15 degrees Celsius per minute.

Annealing the at least one fin may be performed using a lamp anneal. When lamp annealing is used, the raising or lowering of the temperature during the annealing process is performed in a very short time.

Annealing the at least one fin may be performed using a furnace anneal. When furnace annealing is used, the raising or lowering of the temperature during the annealing process is performed in a longer time compared to using lamp annealing; otherwise the, the cooling rate is much slower using furnace annealing compared to using lamp annealing.

For furnace annealing the cooling rate is preferably in the range of about 5 degrees Celsius to 10 degrees Celsius per minute between about 800 degrees Celsius and 500 degrees Celsius.

When a silicon atom leaves its lattice site it becomes an "interstitial" atom and leaves behind a "vacancy". Interstitials and vacancies are created in pairs (and thus in equal numbers). Imbalance in the concentrations of the vacancies and interstitials is created by the ion beam implant. By bringing the wafer to higher temperatures (i.e. annealing), the interstitials around will fill the vacancies trying to maintain the thermodynamic equilibrium. As the wafer cools, the vacancy concentration is reduced in accordance with the dictates of equilibrium by interstitials falling back into vacancies up to the point at which we run out of interstitials and the remaining vacancies become "supersaturated". Those vacancies which are sufficiently close to the surface can diffuse there and recombine with Si interstitials from the surface. The surface of a wafer may be considered to be an infinite sink for excess vacancies and interstitials. The diffusion from the interior of the wafer to the surface takes time and is limited by how fast the vacancies can be transported there.

Thus, depending on the cooling rate, various depths of the silicon beneath the surface are "cleaned out" of vacancies by transport to the surfaces.

The at least one corner of the least one fin has an initial radius of curvature $RC_{initial}$ before the process of creating a supersaturation of point defects in the at least one fin and a final radius of curvature $RC_{final}$ after the process of cooling down the at least one fin. The final radius of curvature $RC_{final}$ of the at least one corner is preferably larger than the initial radius of curvature $RC_{initial}$ of the corner of the fin.

Thus after annealing and cooling down the fin, such that the semiconductor atoms of the fin may migrate via the supersaturation of point defects (e.g. vacancies), the at least one corner of the at least one fin is more rounded in comparison with the initial situation. Otherwise the, the radius of curvature of the at least one fin has become larger after the annealing and cooling down process.

An analogue situation can be seen from the surface roughness of the at least one sidewall of the fin.

The at least one sidewall of the at least one fin has an initial surface roughness $R_{initial}$ before the process of creating a supersaturation of point defects in the at least one fin and a final surface roughness $R_{final}$ after the process of cooling down the at least one fin.

The final surface roughness $R_{final}$ of the at least one sidewall surface is preferably smaller than the initial surface roughness $R_{initial}$ of the at least one sidewall surface of the fin.

Thus after annealing and cooling down the fin, such that the semiconductor atoms of the fin may migrate via the supersaturation of point defects (e.g. vacancies), the at least one sidewall of the at least one fin is more smoothened than the initial situation. Otherwise the, the surface roughness of the at least sidewall surface of the fin has become smaller after the annealing and cooling down process.

Figure 10A:
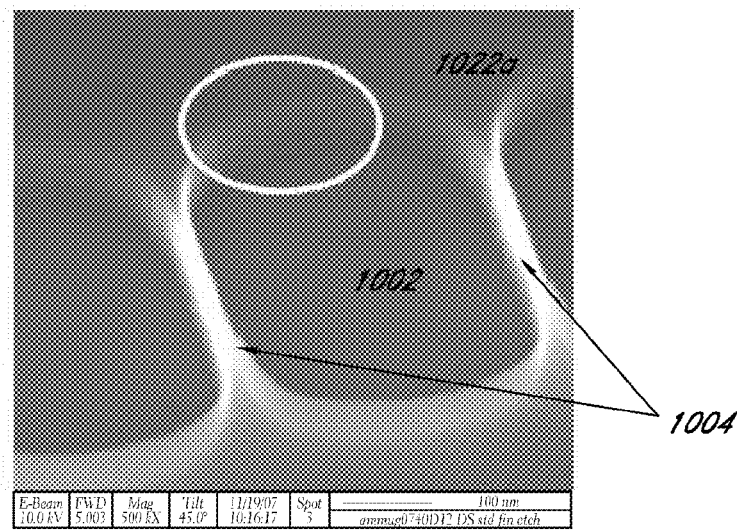
FIGS. 10A, 10B, and 10C show the influence of the annealing and cooling down process on the surface roughness of the sidewall surface(s) of the fin(s).
Figure 10B:
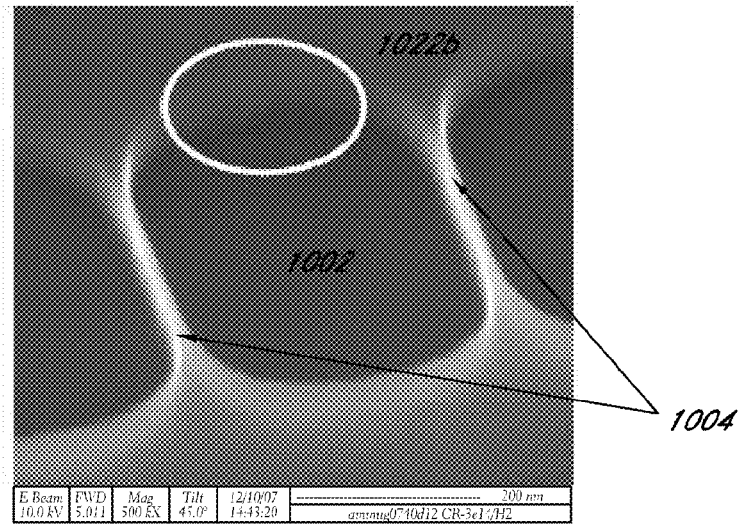
Figure 10C:
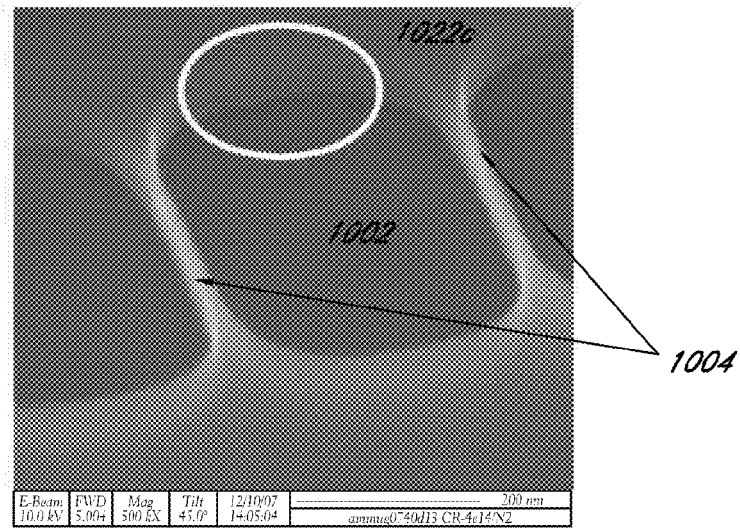

The influence of the annealing and cooling down process on the surface roughness of the sidewall surface(s) of the fin(s) can be seen from experiments (see FIG. 10A, 10B, 10C).

FIG. 10A shows a scanning electron microscopy (SEM) image of a plurality of patterned fins (in this case two fins 1004) patterned in a SOI substrate 1002. The fins have a width of about 10 nm, an initial surface roughness and an initial radius of curvature for the corners of the fin.

FIG. 10B shows a scanning electron microscopy (SEM) image of the fins of FIG. 10A after the process of creating a supersaturation of point defects (i.e. by ion implantation) and a subsequent annealing process of about 5 minutes in hydrogen (H2) at about 800 degrees Celsius with a fast cooling down rate. The annealing process is a lamp anneal and cooling down is performed by turning of the lamps and immediately starting the unload wafer cycle.

FIG. 10C shows a scanning electron microscopy (SEM) image of the fins of FIG. 10A after the process of creating a supersaturation of point defects (i.e. by ion implantation) and a subsequent annealing process of about 5 minutes in nitrogen (N2) at about 800 degrees Celsius with a slow cooling rate. The annealing process is a furnace anneal and cooling down is performed at a slower cooling rate (compared to the one used in FIG. 10B) of about 10 degrees/min between about 800 and 500 degrees Celsius.

The surface roughness of the sidewall surfaces (as shown with circles 1022a, 1022b, 1022c) has become smaller (i.e. smoother sidewall surface) after the slow cooling rate 1022c compared to the initial sidewall surface 1022a and compared to the fast cooling rate 1022b.

Figure 9:
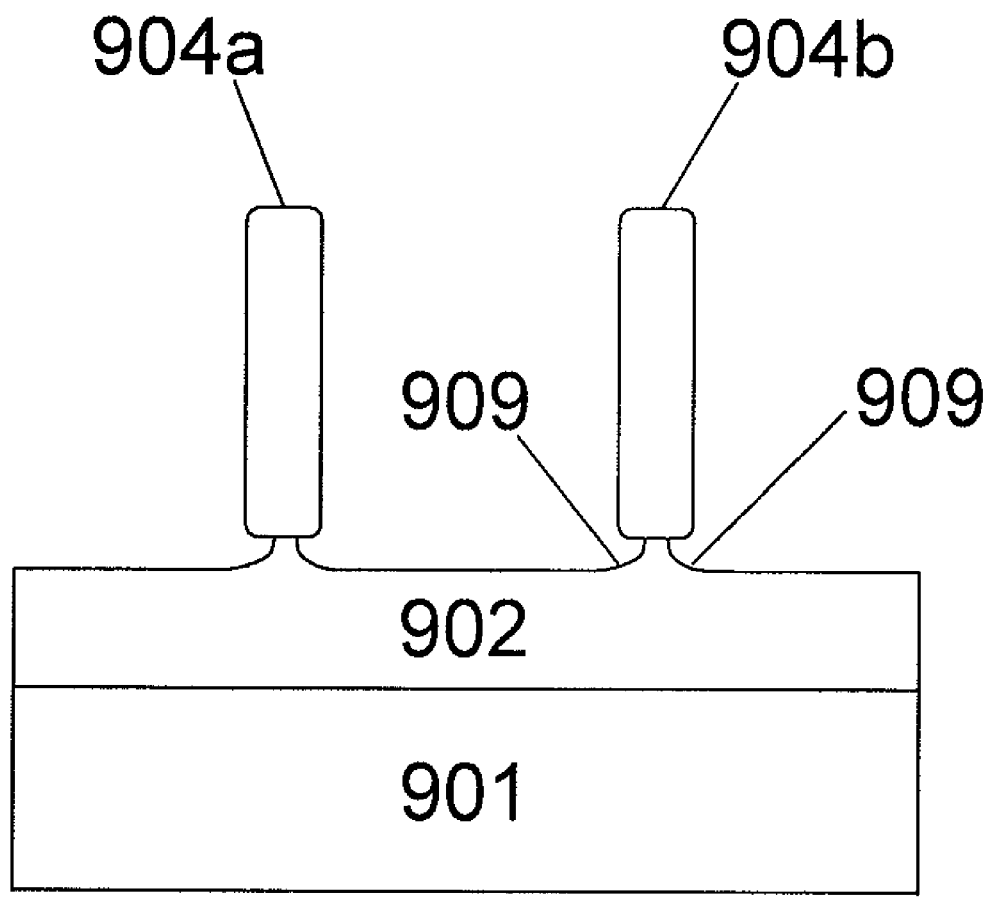
FIG. 9 shows a problem occurring when only using anneal for corner rounding and surface smoothing of the fin.

When only using anneal (for example $H_2$ anneal) for corner rounding of the fin and surface smoothing of the fin, a problem may occur when annealing small fins. Due to the preclean necessary to make the surface oxide free, undercut 909 may occur at the bottom of the fin 904a, 904b (FIG. 9). When anneal is subsequently performed, the fin stability may be deteriorated or, even in extreme conditions, the fin may break free from the underlying substrate.

The corner rounding of the fin should preferably be controlled such that the final radius of curvature $RC_{final}$ does not become larger than half of the fin width.

By using the method according to embodiments of the present inventions, a better corner rounding control can be achieved.

If the final radius of curvature $RC_{final}$ becomes larger than half of the fin width, the fin may break or the fin geometry may change from a rectangular shape to a circular shape. For example for fins with a width of 10 nm, the radius of curvature should be kept between about 0 and 5 nanometer.

For narrow fins a preclean, i.e. a cleaning process before the annealing process, is often important to minimize this undercut and thus maximize fin stability. The preclean typically comprises an HF clean (or wet etch) of the fin in order to remove any oxide from the semiconductor material. This wet etch should be sufficiently long, such that the reactive dangling Si-bonds exposed after removal of the oxide become passivated by hydrogen, thus preventing reoxidation to occur. Any oxide remaining on the Si surface will block the reflow of the underlying Si. By using methods according to embodiments of the present invention the preclean is not as important and critical as for the methods described in the prior art.

It is an advantage of methods described herein that the cleaning process prior to the annealing process is minimized.

It is a further advantage that the box recess, i.e. the undercut at the bottom of the fin, is reduced.

It is a further advantage that the stability for narrow fins (more specifically for fins with a fin width below about 10 nm) is enhanced.

It is another advantage that thermal budget, i.e. the temperature used during the annealing process (i.e. total amount of thermal energy transferred to the wafer during the given elevated temperature operation; proportional to temperature and duration of the process) is reduced.

Since the anneal can be done at low temperature in inert gas (for example about 800 degrees Celsius in $N_2$), Si evaporation is not an issue and combined with better controlled Si migration, will not lead to interrupted fins.

Another advantage is related to the improved sidewall surface roughness of the fins i.e. less roughness of the sidewalls of the fin is obtained according to embodiments of the present invention.

Figure 4A:
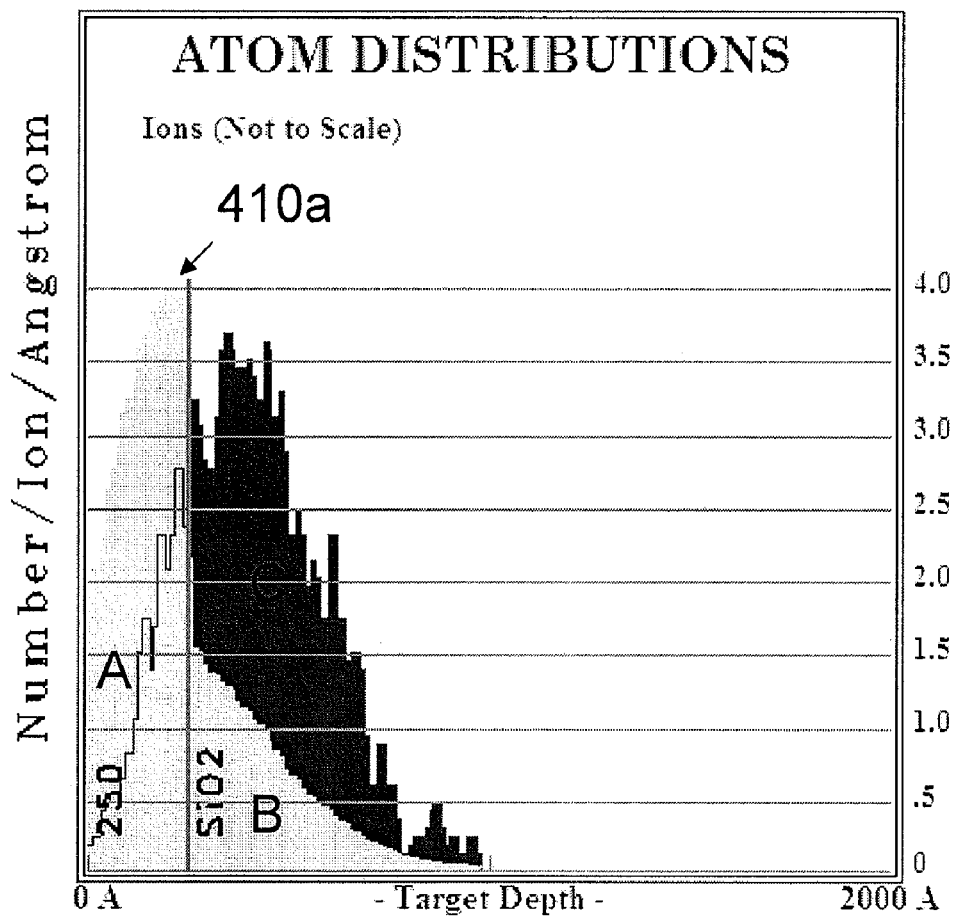
FIGS. 4A and 4B give an example of the vacancy distribution and implanted ion distribution by passing an ion beam through a fin according to certain embodiments of the present invention.
Figure 4B:
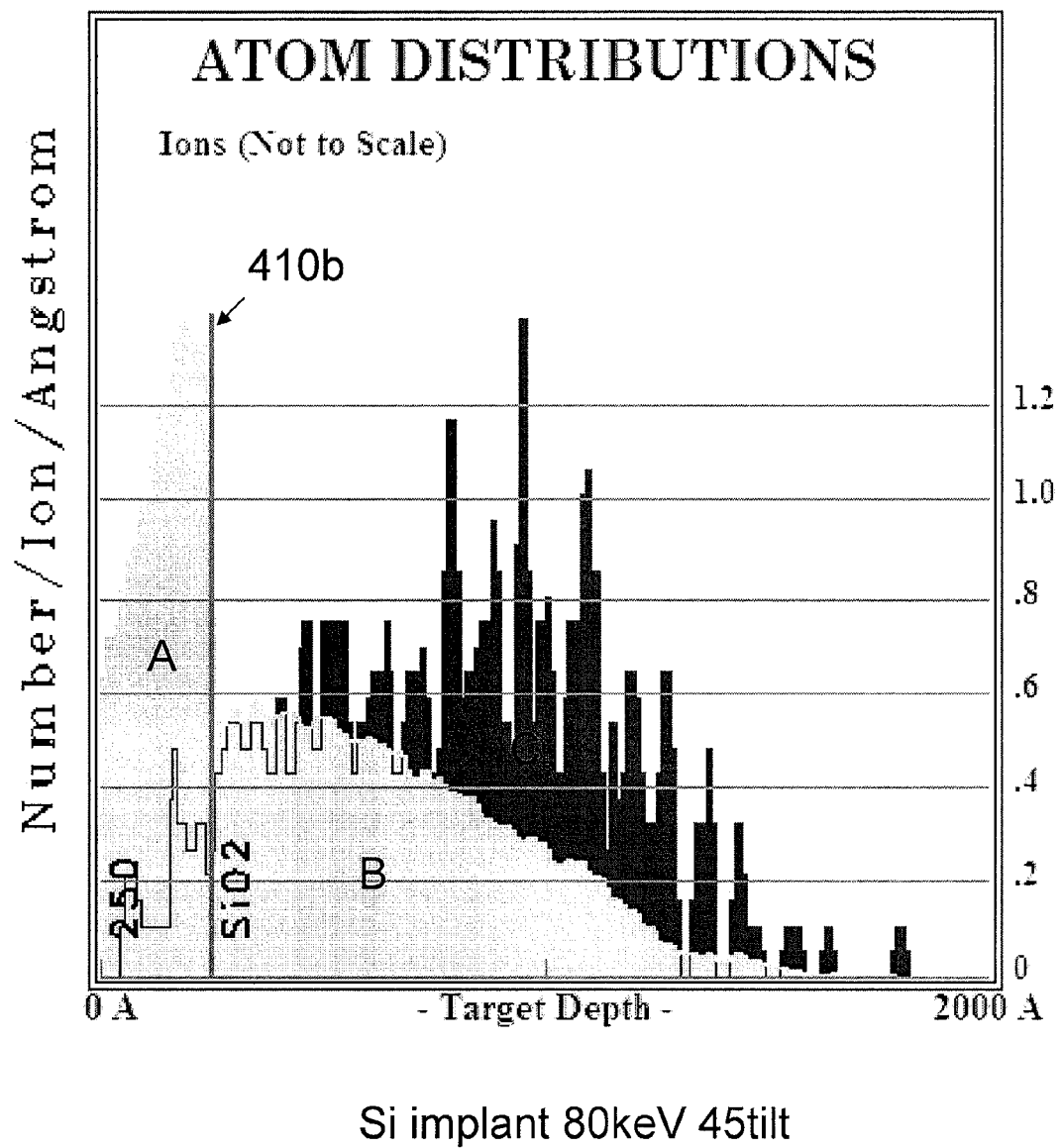

FIG. 4A and FIG. 4B show the vacancy distribution and the implanted ion distribution after passing an ion beam through a fin.

In FIG. 4A a fin has been bombarded with an ion beam, the implantation ion beam comprising Ge ions implanted at an ion beam energy of 80 keV under a tilt angle of 45 degrees. Regions A and B of the light colored distribution comprise the distribution of vacancies (also called Si recoil distribution) after passing the Ge ion beam through the Si fin. The interface between the bottom of the Si fin and the underlying insulating region ($SiO_2$) is denoted by line 410a. The highest distribution of vacancies is present in the Si fin (left from 410a), whereas the Ge ions are mainly present at the interface in the insulating layer (right from 410a). This shows that the ions from the ion beam are implanted into an insulating layer and not into the fin. In the fin an excess of vacancies is created. In FIG. 4B, a fin has been bombarded with an ion beam, the implantation ion beam comprising Si ions implanted at an ion beam energy of 80 keV under a tilt angle of 45 degrees. Regions A and B of the light colored distribution comprise the distribution of vacancies (also called Si recoil distribution) after passing the Si ion beam through a Si fin. The interface between the bottom of the Si fin and the underlying insulating region ($SiO_2$) is denoted by line 410b. The highest distribution of vacancies is present in the Si fin (left from 410b), whereas the Si ions are mainly present deep in the insulating layer (right from 410b). This shows that the ions from the ion beam are implanted into the insulating layer and not into the fin. Due the lower atomic weight of Si compared to Ge, the Si ions can penetrate much deeper into the insulating layer as is also shown for Si in FIG. 4B compared to Ge in FIG. 4A. In the fin an excess of vacancies is created.

In FIG. 5, a comparison is shown between scanning electron microscopy (SEM) images taken at a tilt angle of 45 degrees of a plurality of fins (in this case two fins 504) patterned in a SOI substrate 502 using a standard corner rounding process (FIG. 5A) and using a method according to embodiments of the present invention (FIG. 5B).

FIG. 6A and FIG. 6B show a zoomed scanning electron microscopy (SEM) image respectively of FIG. 5A and FIG. 5B.

In FIG. 5A and FIG. 6A the fins underwent a standard process as known in prior art, i.e. a sidewall oxidation and subsequent $H_2$ anneal during 2 minutes at 850 degrees Celsius.

In FIG. 5B and FIG. 6B the fins underwent a process according to embodiments of the present invention, i.e. a Ge ion implantation through the fins and a subsequent $N_2$ anneal during 5 minutes at 800 degrees Celsius.

A smoothing of the sidewall surfaces can be clearly seen on the SEM image (FIG. 5B, 6B) after the process according to embodiments of the present invention.

In FIG. 5A, 6A the top surfaces of the fins are rough because of Si evaporation and local enhanced Si migration due to small fin width variations and not smoothened compared to the sidewall surfaces in FIG. 5B, 6B.

FIG. 7A and FIG. 7B compare scanning electron microscopy (SEM) images of a plurality of fins (in this case two fins 704) patterned in a SOI substrate 702 using a standard corner rounding process based on H2 anneal (FIG. 7A) and using a method according to embodiments of the present invention (FIG. 7B).

Using the standard procedure (FIG. 7B) it is seen that fins are broken as shown for example by the circles. Due to the smoothing process and fin corner rounding of the small fins (in this example a fin width of approximately 8 nm) the fin stability is deteriorated. As a consequence at certain points the fin breaks, otherwise the, all the silicon has reflown and partially evaporated.

Using a method according to embodiments of the present inventions, the fin stability is optimized and smooth sidewall surfaces are created (FIG. 7B).

Figure 8:
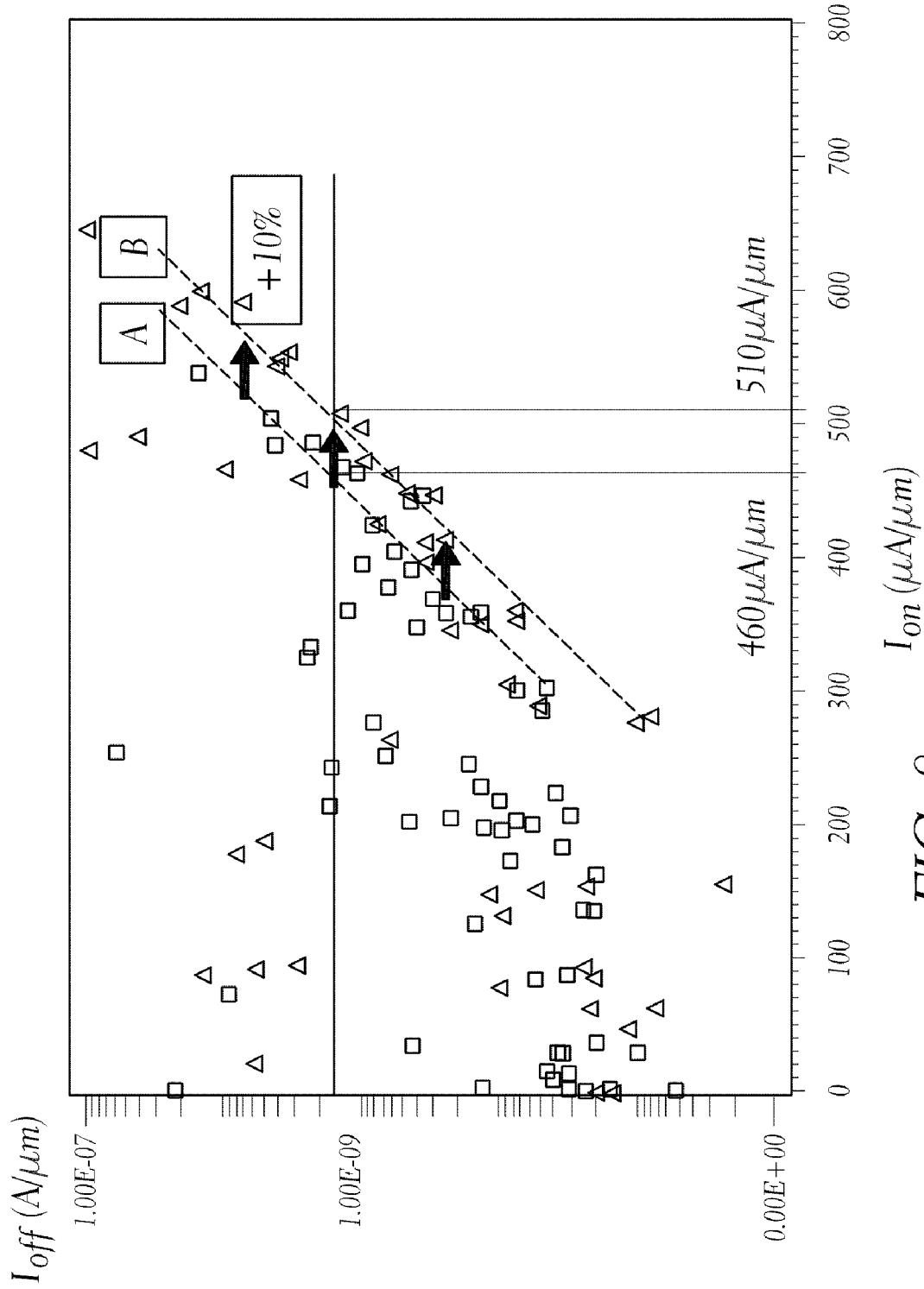
FIG. 8 is an example of an Ion-Ioff graph for an NMOS finFET device fabricated according to certain embodiments of the present invention.

FIG. 8 shows $I_{on}$-$I_{off}$ of a NMOS FinFET fabricated on a standard SOI wafer. Squares represent the data as obtained when using standard procedure for sidewall surface smoothing of the NMOS FinFET (i.e. H2 anneal for 5 minutes at 850 degrees Celsius), while triangles represent the data as obtained by using methods according to embodiments of the present invention (in this example Ge ion implant and subsequent N2 oven anneal for 5 minutes at 800 degrees Celsius).

A 10% drive current increase is measured for the NMOS FinFET using corner rounding and sidewall surface smoothing according to embodiments of the present invention, i.e. more specifically a Ge ion implantation through the fins and a subsequent $N_2$ oven anneal during 5 minutes at 800 degrees Celsius.

The drive current of approximately 460 µA/µm using standard procedure has increased to 510 µA/µm using methods according to embodiments of the present invention.

In further processes according to certain embodiments of the present invention, additionally source and drain regions may be defined, a gate dielectric and gate electrode may be formed on the at least one fin using methods as known for a person skilled in the art. Spacer may be formed to isolate the gate from the source/drain regions, contact may be formed for example by silicidation.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention.

What is claimed is:

1. A method of fabricating a semiconductor device, comprising:
    providing a substrate comprising a semiconductor material;
    forming at least one fin in the substrate, the fin comprising a top surface, at least one sidewall surface, and at least one corner;
    after forming at least one fin, creating a supersaturation of point defects in the at least one fin by passing at least one beam of electrically inactive species through the at least one fin, the supersaturation of point defects being a concentration of point defects being larger than the concentration of point defects in the fin at thermodynamic equilibrium; and
    annealing and subsequently cooling down the at least one fin such that semiconductor atoms of the semiconductor material migrate via the point defects thus rounding the at least one corner and smoothening the at least one sidewall surface.

2. The method according to claim 1, wherein the at least one sidewall surface of the at least one fin has an initial surface roughness $R_{initial}$ prior to the creating of a supersaturation of point defects, and the at least one sidewall surface of the at least one fin has a final surface roughness $R_{final}$ after the cooling down of the at least one fin, the final surface roughness $R_{final}$ being smaller than the initial surface roughness $R_{initial}$.

3. The method according to claim 1, wherein the at least one corner of the at least one fin has an initial radius of curvature $RC_{initial}$ prior to the creating of a supersaturation of point defects, and the at least one corner of the at least one fin has a final radius of curvature $RC_{final}$ after the cooling down of the at least one fin, the initial radius of curvature $RC_{initial}$ being smaller than the final radius of curvature $RC_{final}$.

4. The method according to claim 3, wherein the at least one fin has a width W and the final radius of curvature $RC_{final}$ is smaller than half of the fin width.

5. The method according to claim 1, wherein the patterned fin further comprises an initial concentration of point defects and wherein the supersaturation of point defects is a concentration of point defects being larger than the initial concentration of point defects in the fin.

6. The method according to claim 1, wherein the supersaturation of point defects comprises a supersaturation of vacancies.

7. The method according to claim 1, wherein the electrically inactive species comprises one or more of Ge, Si, or C.

8. The method according to claim 1, wherein at least part of the electrically inactive ions of the at least one beam are implanted in an insulating region after the passing through the at least one fin.

9. The method according to claim 8, wherein the insulating region is located aside of the semiconductor material of the at least one fin.

10. The method according to claim 8, wherein the substrate is a semiconductor-on-insulating substrate.

11. The method according to claim 1, wherein passing the at least one beam through the at least one fin is performed under an angle α with respect to the top surface of the at least one fin.

12. The method according to claim 11, wherein the angle α is different from 0 degrees such that the at least one beam comes in at the at least one sidewall of the fin.

13. The method according to claim 12, wherein the angle α is smaller than 90 degrees.

14. The method according to claim 12, wherein the angle α is smaller than or equal to 45 degrees.

15. The method according to claim 11, wherein the angle α is about 0 degrees such that the at least one beam is coming in at the top surface of the fin.

16. The method according to claim 15, wherein an insulating region is located below the semiconductor material of the at least one fin.

17. The method according to claim 1, wherein the passing of the at least one beam further comprises passing a second beam under an angle β with respect to the top surface of the at least one fin, the second beam coming in at an opposite sidewall of the fin of the at least one sidewall of the fin.

18. The method for according to claim 17, wherein the angle β is equal to the angle-α.

19. The method according to claim 1, wherein the annealing of the at least one fin is performed in an inert ambient.

20. The method according to claim 19, wherein the inert ambient comprises an inert gas, the inert gas comprising at least one of nitrogen, argon, neon, or helium.

21. The method according to claim 1, wherein the annealing is performed at a temperature in the range of about 700 degrees Celsius to 900 degrees Celsius.

22. The method according to claim 1, wherein the cooling down is performed at a cooling rate lower than about 15 degrees Celsius per minute.

23. The method according to claim 1, wherein the forming of the at least one fin further comprises providing an array of fins comprising at least a first fin located at a fin pitch from a second fin.

24. A method of making a semiconductor device, comprising:
after forming at least one fin in a substrate, creating a supersaturation of point defects in the at least one fin by passing at least one beam of electrically inactive species through the at least one fin, the supersaturation of point defects being a concentration of point defects being larger than the concentration of point defects in the fin at thermodynamic equilibrium, the substrate comprising a semiconductor material; and
annealing and subsequently cooling down the at least one fin having a supersaturation of point defects such that semiconductor atoms of the semiconductor material migrate via the point defects thus rounding a corner of the at least one fin and smoothening a sidewall surface of the at least one fin.

\* \* \* \* \*